(12) United States Patent
McCormick

(10) Patent No.: US 6,369,448 B1
(45) Date of Patent: Apr. 9, 2002

(54) VERTICALLY INTEGRATED FLIP CHIP SEMICONDUCTOR PACKAGE

(75) Inventor: John P. McCormick, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/489,302

(22) Filed: Jan. 21, 2000

(51) Int. Cl.[7] .............................................. H01L 23/48
(52) U.S. Cl. ..................... 257/777; 257/780; 257/737; 257/723
(58) Field of Search ............................. 257/777, 778, 257/780, 737, 738, 723, 686

(56) References Cited

U.S. PATENT DOCUMENTS

| | | | |
|---|---|---|---|
| 5,266,912 A | * 11/1993 | Kledzik ........................ | 257/664 |
| 5,491,362 A |   2/1996 | Hamzehdoost et al. ...... | 257/712 |
| 5,552,596 A | *  9/1996 | Ravetto et al. .............. | 257/777 |
| 5,591,959 A | *  1/1997 | Cigna et al. ................. | 257/777 |
| 5,608,262 A | *  3/1997 | Degani et al. ............... | 257/723 |
| 5,656,856 A | *  8/1997 | Kweon ........................ | 257/686 |
| 5,734,199 A | *  3/1998 | Kawakita et al. ........... | 257/737 |
| 5,760,478 A |   6/1998 | Bozso et al. ................. | 257/777 |
| 5,783,870 A | *  7/1998 | Mostafazadeh et al. ..... | 257/791 |
| 5,801,448 A | *  9/1998 | Ball ............................ | 257/778 |
| 5,804,882 A | *  9/1998 | Tsukagoshi et al. ........ | 257/783 |
| 5,869,894 A | *  2/1999 | Degani et al. ............... | 257/723 |
| 5,909,057 A |   6/1999 | McCormick et al. ........ | 257/704 |
| 5,949,135 A | *  9/1999 | Washida et al. ............. | 257/685 |
| 5,963,429 A |  10/1999 | Chen | |
| 5,963,430 A |  10/1999 | Londa .......................... | 361/790 |
| 5,973,930 A | * 10/1999 | Ikeda et al. .................. | 257/723 |
| 5,977,640 A | * 11/1999 | Bertin et al. ................. | 257/777 |
| 6,002,178 A | * 12/1999 | Lin .............................. | 257/778 |

(List continued on next page.)

FOREIGN PATENT DOCUMENTS

JP  359127856  7/1984  ..................... 25/4

OTHER PUBLICATIONS

APack, Flip Chip Assembly.
Third party designs.
Cicone et al., "Silicon Integrated High Performance Package", IBM Technical Disclosure Bulletin, vol. 27, No. 7B, Dec. 1984.
Shah et al., "Dual Chip In Package", Claims of U.S. Patent application Ser. No. 09/467,543, Filed Dec. 10, 1999, pp. 13–15 (Our Ref: LSI1P161).
Rajagopalan et al., "Multi–Chip Package Including Memory and Logic", Claims of U.S. Patent application Ser. No. 09/461,704, Filed Dec. 14, 1999, pp. 15–17 (Our Ref: LSI1P163).

Primary Examiner—Eddie Lee
Assistant Examiner—Lourdes Cruz
(74) Attorney, Agent, or Firm—Beyer, Weaver & Thomas LLP

(57) ABSTRACT

Provided is a vertically integrated ("chip-over-chip") semiconductor package and packaging method. The invention provides higher packaging density and performance, including increased functionality, decreased signal propagation delays, improved circuit switching speed, lower thermal resistance and higher thermal dissipation measurements, relative to previous package designs. According to the invention, a semiconductor package may be composed of a flip chip (or chips) overlying one or more other flip chips, all electrically bonded to flip chip bond pads on a cavity-less semiconductor substrate. The upper and lower flips chips may be assembled in a variety of different configurations and may be thermally or electrically connected to each other. In a preferred embodiment, the flip chips, particularly the lower flip chip(s), are thinned so that the overall package height is within conventional ranges for traditional single chip packages. Packages in accordance with the invention have increased access speeds between chips and reduced total chip package footprint.

15 Claims, 3 Drawing Sheets

U.S. PATENT DOCUMENTS

| | | | |
|---|---|---|---|
| 6,005,292 A | * 12/1999 | Roldan et al. | 257/777 |
| 6,014,316 A | * 1/2000 | Eide | 257/777 |
| 6,025,648 A | * 2/2000 | Takahashi et al. | 257/778 |
| 6,057,598 A | * 5/2000 | Payne et al. | 257/723 |
| 6,084,308 A | * 7/2000 | Kelkar et al. | 257/777 |
| 6,181,008 B1 | 1/2001 | Avery et al. | |

* cited by examiner

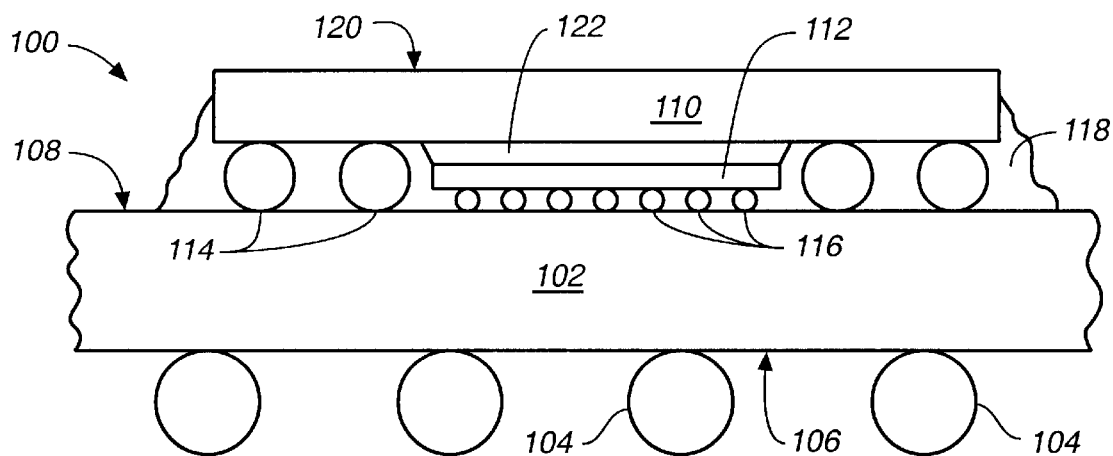
FIG._1
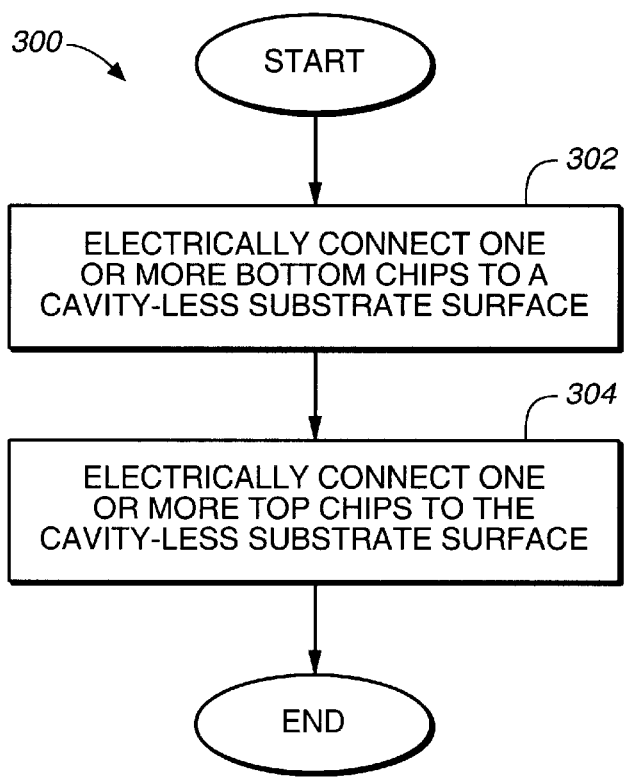
FIG._3

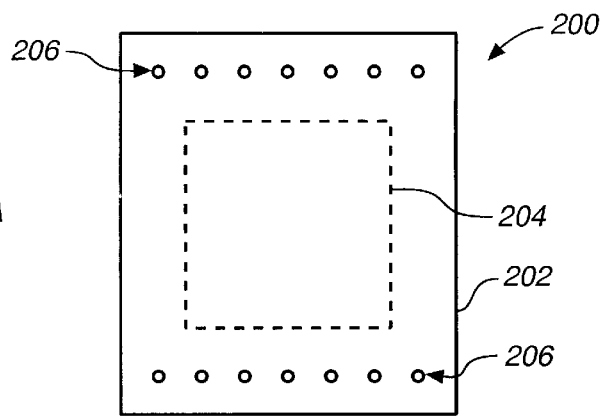
FIG._2A
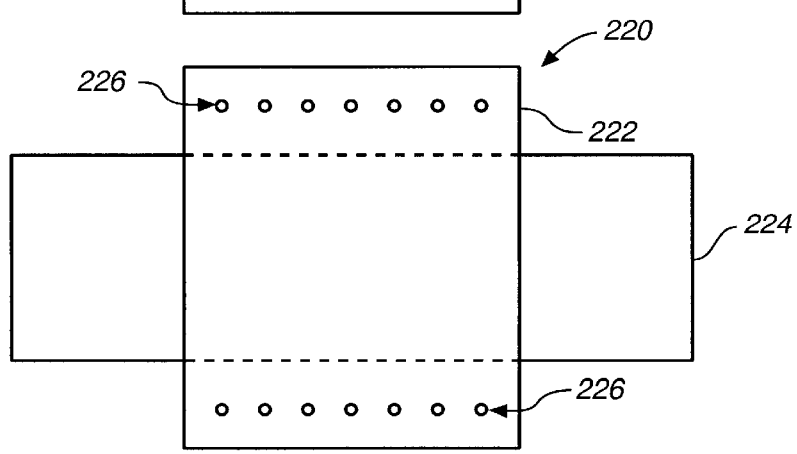
FIG._2B
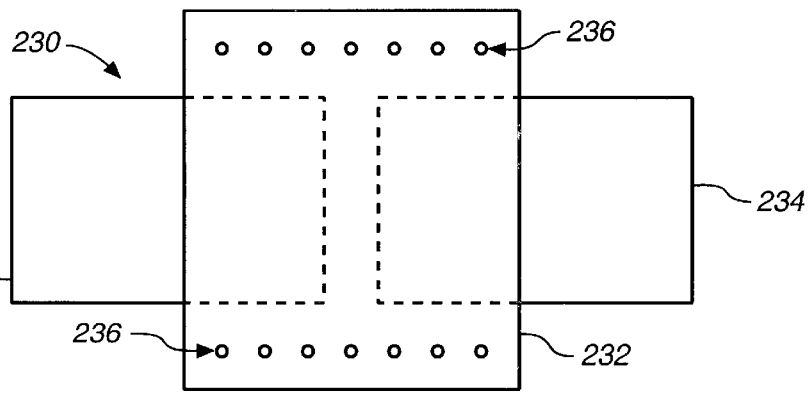
FIG._2C
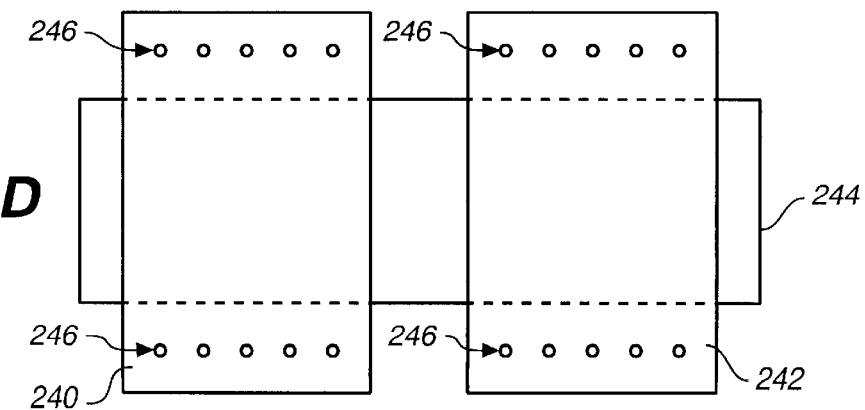
FIG._2D

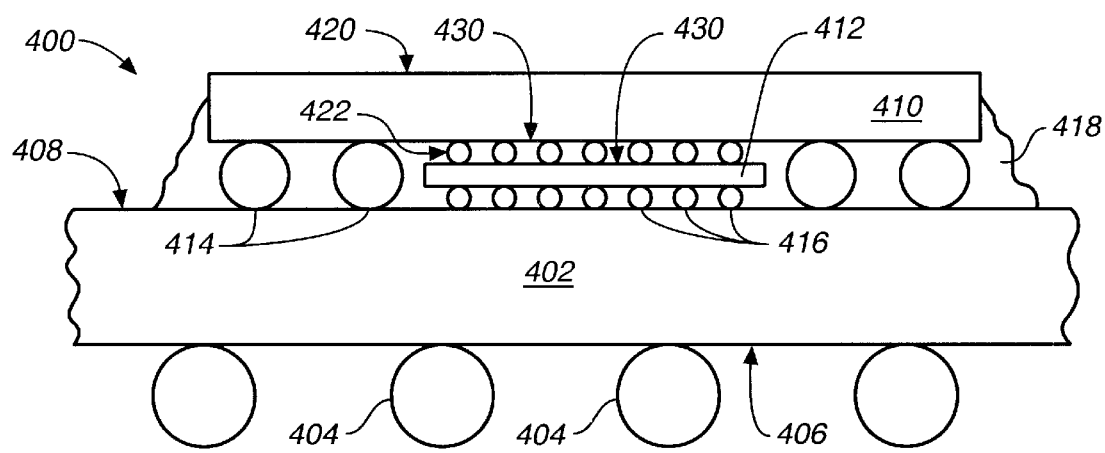
FIG._4
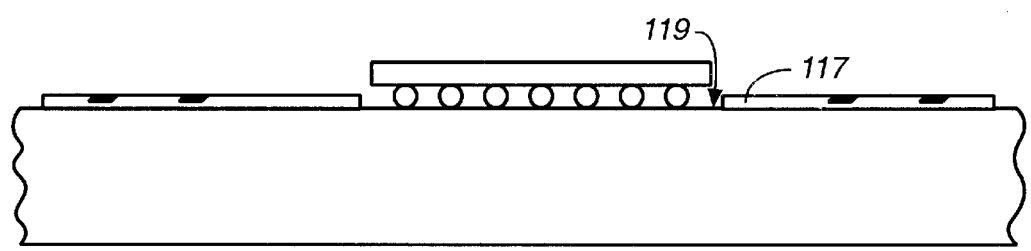
FIG._5

VERTICALLY INTEGRATED FLIP CHIP SEMICONDUCTOR PACKAGE

BACKGROUND OF THE INVENTION

This invention relates generally to semiconductor packaging. More specifically, the invention relates to the design and manufacturing process of a semiconductor package incorporating of more than one integrated circuit chip.

A semiconductor package generally connects an integrated circuit chip to the external circuitry on a printed circuit board. To use the functionality of multiple integrated circuit chips, multiple semiconductor packages are typically used to connect these chips to the printed circuit board. With integrated circuit devices increasing in speed in complexity, the bottleneck limiting high performance is often not the chips themselves, but the electrical pathways between integrated circuits. One particularly glaring example of this bottleneck exists between high performance graphics chips and the high capacity memory chips the graphics chips require. ASIC graphic chips are sometimes placed alongside packaged memory chips, but the electrical pathways limit the speed at which the graphic chips can access the memory components. Furthermore, placing memory chips alongside a graphics chip is often not space efficient, and does little to maximize circuit density. Quad flat pack (QFP) packages often used for memory chips and flip chip packages are currently manufactured separately.

One solution to this problem is to use embedded memory on the logic chip. Embedded memory allows designers to drastically increase internal bandwidth and access speeds, reduce total pin count, and improve space efficiency. However, the cost of embedded memory is still far higher than that of discrete memory chips. Embedded memory also requires a tradeoff between chip area used for storage versus chip area used for logic. Many of the advantages of embedded memory are offset by the higher costs of embedded memory technology, especially for systems where chip area is not a critical issue.

Another solution currently used is the adjacent placement of logic and memory chips in a single package. Two separate chips, often a logic chip and a memory chip, are packaged in a single multiple chip package. These multiple chip modules often comprise two wire bond chips located adjacent to one another in a single layer of a single package. The memory chip in this instance has a shorter trace to the logic chip than it would if it was packaged separately, but the trace length is still significant. Furthermore, the footprint of the chip package still covers an area much larger than that of a logic chip with embedded memory.

More recently, multi-chip packaging methods have been proposed that provided for a plurality of chips deployed in more than one layer of a package. Examples include a stack of chips connected on edges by metal lines/connectors, and a stack of chips wire-bonded, flip chip bonded and/or otherwise bonded to one another and to the package substrate. The footprint of a multi-chip package is reduced in this vertical orientation approach, but complex chip to chip interconnection techniques, such as for the stacked chip edge connection designs, may be required. Also, existing techniques may require two or more methods, such as flip chip, wire bonding, and/or tape-automated bonding, for example, for connecting chips to each other and to the package substrate. Further, existing techniques may require more vertical space, or a larger package height, to accommodate multiple IC chips and wire-bond loops.

Portable electronic products such as portable cell-phones and cameras, and smart cards require ultra-thin IC packaging technologies and are yet demanding semiconductor technologies of greater complexity.

Consequently, what is needed is an improved multi-chip package technology that will increase package density, improve performance, including increasing access speeds between chips by significantly reducing trace lengths, while not substantially increasing package height or the complexity of packaging techniques.

SUMMARY OF THE INVENTION

To achieve the foregoing, the present invention provides a vertically integrated ("chip-over-chip") semiconductor package and packaging method. The invention provides higher packaging density and performance, including increased functionality, decreased signal propagation delays, improved circuit switching speed, lower thermal resistance and higher thermal dissipation measurements, relative to previous package designs. According to the invention, a semiconductor package may be composed of a flip chip (or chips) overlying one or more other flip chips, all electrically bonded to flip chip bond pads on a cavity-less semiconductor substrate. The upper and lower flips chips may be assembled in a variety of different configurations and may be thermally or electrically connected to each other. In a preferred embodiment, the flip chips, particularly the lower flip chip(s), are thinned so that the overall package height is within conventional ranges for traditional single chip packages. Packages in accordance with the invention have increased access speeds between chips and reduced total chip package footprint.

In one aspect, the invention provides a semiconductor package. The package includes a packaging substrate having a cavity-less surface and a plurality of flip chip bonding pads on the surface. The package also includes one or more lower flip chip devices, each having a top surface and a bottom surface. The one or more lower flip chip devices is electrically connected to the substrate via solder bump connectors between the bottom surface and a first potion of the flip chip bonding pads. The package additionally includes one or more upper flip chip devices overlying at least a portion of the one or more lower flip chip devices. The one or more upper flip chip devices is connected to the substrate via solder bump connectors between a substrate-facing surface and a second portion of the flip chip bonding pads.

In another aspect, the invention provides a semiconductor packaging method. The method involves electrically connecting one or more lower flip chip devices to a first portion of flip chip bonding pads on a cavity-less semiconductor substrate surface, and electrically connecting one or more upper flip chip devices overlying at least a portion of the one or more lower flip chip devices to a second portion of flip chip bonding pads on the semiconductor substrate.

These and other features and advantages of the present invention are described below with reference to the drawings.

BRIEF DESCRIPTION OF THE DRAWINGS

FIG. 1 shows a cross-sectional view of a chip-over-chip package in accordance with a preferred embodiment of the present invention.

FIGS. 2A–2D show top views of chip-over-chip packages, in accordance with preferred embodiments of the present invention.

FIG. 3 presents a flow chart outlining a semiconductor packaging method in accordance with a preferred embodiment of the invention.

FIG. 4 shows a cross-sectional view of a chip-over-chip package in accordance with an alternate preferred embodiment of the present invention.

FIG. 5 shows a cross-sectional view of a chip-over-chip package with a shallow indentation shown in accordance with one embodiment of the present invention.

DETAILED DESCRIPTION OF PREFERRED EMBODIMENTS

Reference will now be made in detail to some presently preferred embodiments of the invention. Examples of preferred embodiments are illustrated in the accompanying drawings. While the invention will be described in conjunction with these preferred embodiments, it will be understood that it is not intended to limit the invention to any particular preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a vertically integrated ("chip-over-chip") semiconductor package and packaging method. The invention provides higher packaging density and performance, including increased functionality, decreased signal propagation delays, improved circuit switching speed, lower thermal resistance and higher thermal dissipation measurements, relative to previous package designs. According to the invention, a semiconductor package may be composed of a flip chip (or chips) overlying one or more other flip chips, all electrically bonded to flip chip bond pads on a cavity-less semiconductor substrate. The upper and lower flips chips may be assembled in a variety of different configurations and may be thermally or electrically connected to each other. In a preferred embodiment, the flip chips, particularly the lower flip chip(s), are thinned so that the overall package height is within conventional ranges for traditional single chip packages.

FIG. 1 shows a cross-sectional view of a chip-over-chip package in accordance with a preferred embodiment of the present invention. The package 100 includes a packaging substrate 102 composed of any suitable material, such as ceramic or polymer/composite materials well known to those of skill in the art, for example teflon, FR4, FR5, BT-resin and various ceramics. The substrate may have solder balls 104 on its underside 106 to provide electrical connection of the package to a printed circuit board (PCB) (not shown). The package may also be of any suitable shape or size for its intended application, such as square, rectangular, large (e.g., greater than 50 mm per side), small (e.g., less than 10 mm per side), with or without mechanical stiffeners or heatspreaders, and others.

According to the present invention, a plurality of flip chips may be connected, with at least one chip overlying another, to a cavity-less upper surface of a substrate, that is a substrate that does not have a cavity in which a chip connected to the substrate is accommodated. A "cavity" in this context is understood in the art to mean an indentation in the packaging substrate (e.g., base laminate) surface formed by removal of a portion of the substrate material. For example, it is well known in the art that packaging substrates may be provided with cavities for accommodating chips connected to the substrate and/or exposing additional electrical bonding locations in non-surface layers of the packaging substrate. Such cavities are typically about 0.25 to 0.8 mm deep. It is this meaning of cavity that is intended in this application, and the term "cavity-less" is used in the present invention to exclude such cavities.

It should be noted, however, that the term "cavity-less," as used herein, is not intended to exclude very shallow indentations that do not involve cutting or otherwise indenting the base packaging substrate laminate material, such as those that may be formed by forming thin layers a material or materials on the surface of a packaging substrate. For example, one or more solder mask, metal, and/or dielectric layers about 25 $\mu$m thick, for example, may be deposited and patterned on the surface of a packaging substrate. Such patterned layers may provide some relief on a packaging substrate surface that is nevertheless cavity-less, as that term is understood in the art and used herein. In a chip-over-chip package in accordance with the present invention, a bottom chip or chips may be positioned within these surface (non-cavity) indentations thereby reducing the clearance required for the top chip or chips and the corresponding height of the solder bumps required to electrically connect the top chip(s) FIG. 5 shows shallow indentation 119 in substrate 102 formed by a deposited layer 117.

As depicted in FIG. 1, the substrate 102 has a cavity-less upper surface 108. The surface 108 has an array of flip chip bonding pads 115 provided for connection of flip chips to the substrate via ball grid arrays (BGAs). The substrate 102 has two flip chips electrically connected to it via BGAs: A larger, upper chip 110 overlies a lower, smaller chip 112. Both chips may be underfilled with an underfill material 118, for example with any commonly used material for mechanical, chemical and/or humidity protection. Overmolding techniques may also be applied. A heatspreader and/or stiffener (not shown) may be attached, using a thermally-conductive adhesive or other material, to the backside 120 of the top chip 110 to improve package performance. The bottom chip 112 could be attached to the top chip 110 with a thermally-conductive adhesive 122 or other material to improve performance and/or reliability.

The upper chip 110 is generally thicker, in addition to being larger, than the lower chip 112. For example, the upper chip may have a conventional thickness of about 13–30 mils, although the top chip may also be thinned, to from about 50 $\mu$m to about 500 $\mu$m (about 2–20 mils). The lower chip may again be a chip of conventional thickness, however, the lower chip is preferably thinned, for example by wet etching, micro-grinding, plasma etching, or other such method, to a thickness of about 50 $\mu$m to 200 $\mu$m (about 2–4 mils). Thinning the bottom chip allows for the top chip to be positioned over it and flip chip bonded to the substrate using perimeter solder balls having diameters within a desirable/allowable range (e.g., not exceeding 7 mils). In this way, the two flip chips may be vertically integrated on the packaging substrate without the need for a cavity in the substrate. This arrangement makes maximum use of the substrate surface for electrically connecting to the chips (as opposed to a situation where one or more chips are wire bonded to the substrate, and so the space immediately below the bottom chip is unavailable for bonding) and the body of the substrate is filly available for accommodating routing connections (as opposed to the situation where a cavity is formed in the substrate, thereby reducing the available space for routing connections to be formed in the substrate).

The size of the solder bumps 116 in the lower chip's BGA is smaller than the solder bumps 114 in the upper chip's BGA in order to accommodate the different standoff heights of each chip from the package substrate 102. For example, the top chip's BGA may have solder bumps about 4–7 mils in diameter, while the bottom chips BGA may have solder bumps about 2 mils in diameter. The solder bumps in both BGAs may be made of either eutectic solder, high-lead solder, electrically-conductive adhesive, or other materials such as are well known to those of skill in the art.

Where the top 110 and bottom 112 chips are connected with a thermally-conductive adhesive 122, the adhesive may be composed of materials well known in the art. The bond may be about 1–2 mils thick. It should be noted that in one alternative embodiment of the present invention, top and bottom chips may be directly electrically connected, as described further with reference to FIG. 4, below.

FIGS. 2A–2D show top views of chip-over-chip packages, illustrating some alternative configurations of top and bottom vertically integrated chip packages in accordance with the present invention. As shown in FIG. 2A, the chip-over-chip package 200 could include a larger top chip 202 which completely overlies a smaller bottom chip 204 (shown in phantom lines to indicate its position below the top chip 202). For example, the top chip 202 could be about 10 mm to 20 mm (on a side) in size with two or more rows of perimeter bumps 206, and the bottom chip 204 could be about 3 mm to 12 mm in size and have full or partial arrays of bumps, or only perimeter-row bumps (not shown).

FIG. 2B shows an alternative package configuration 220, in which a top chip 222 partially overlies a bottom chip 224 that is smaller in one dimension 223 than the top chip 222, but larger in the other dimension 225. In this example, the top chip has two rows of perimeter bumps 226 on parallel sides so that the bottom chip 224 may extend beyond the top chip 222 in the dimension in which it is larger without interfering with the connection of the top chip to the substrate to which both chips are connected (not shown).

Alternatively, as shown in FIG. 2C, one larger top chip 232 may be combined in a vertically integrated package 230 with two or more bottom chips 234. The top chip 232 may partially (as shown in FIG. 2C) or completely cover the bottom chips 234, and may have two or more rows of perimeter bumps 236. For example, a larger top chip of about 15 mm to 20 mm in size could accommodate several smaller, bottom chips of about 2 mm to 4 mm in size.

Moreover, it should be understood that the principles of the present invention may be extended to include a plurality of both top and bottom chips, up to many multiples of both, in a single package in accordance with the present invention. For example, one package substrate could support two or more top chips each with one or more bottom chips. The top chip(s) could again have one, two or more rows of perimeter bumps while the bottom chips could have full or partial arrays of bumps, or only perimeter-row bumps. FIG. 2D shows two top chips (240, 242) combined with bottom chip 244. Each of the top chips is shown with two rows of perimeter bumps 246. It should be noted that configurations beyond those specifically depicted here are possible, and that these configurations are not intended to be limiting.

Assembly of chip-over-chip packages in accordance with the present invention may be done in several different ways. Flip chip packaging techniques are well known in the art, and one of ordinary skill would know how to adapt them to constructing packages in accordance with the present invention, given the parameters provided herein. For example, the bottom chip(s) could first be attached to the package substrate using well known flip chip bonding techniques, followed by attachment of the top chip(s). Or, the bottom and top chips could be substantially simultaneously bonded to the substrate in a single step (e.g., a single reflow to attach both chips). Alternatively, the bottom chip (s) could first be attached to the top chip(s), for example, with a thermal adhesive, and then both bottom and top chips substantially simultaneously bonded to the package substrate using well known flip chip bonding techniques.

Many different bumping technologies and/or their combinations, such as eutectic or high-lead solder bumping, conductive adhesive bumping, stud bumping and anisotropic adhesive attachment, could be used for providing flip chip electrical connections in a chip-over-chip package in accordance with the present invention. The package could be constructed with or without underfill materials and/or thermal or mechanical adhesives. Where underfill is used, the top and bottom chips could be separately underfilled, or the same underfill, done simultaneously, could be used for top and bottom chips. The package could also be constructed with a variety of other interconnection methods, such "fuzz-bottom" interconnects and thermo-compression bonding.

FIG. 3 presents a process flow chart outlining a semiconductor packaging method in accordance with a preferred embodiment of the invention. The process flow 300 involves electrically connecting one or more lower flip chip devices to a portion of flip chip bonding pads on a cavity-less semiconductor substrate surface (302). As noted above, the bonding pads may be in an array or at the chip(s) perimeter. These lower chip bonding pads are generally at least partially within another set of bonding pads provided for flip chip binding of a top chip or chips that will completely or partially overlap the bottom chip or chips. The substrate does not have a cavity for accommodating a chip or chips; instead, in at least one preferred embodiment, a bottom chip or chips are thinned sufficiently to allow for effective flip chip connections between an overlying top chip and the substrate. As noted above, very shallow indentations that are not the result of any cutting and removal (or otherwise formed indentations of the base substrate laminate) of the packaging material may be present on the packaging substrate surface consistent with the present invention.

An upper flip chip device (or devices) overlying at least a portion of the one or more lower flip chip devices are bonded to the second portion of the flip chip bonding pads on the semiconductor substrate (304). As noted above, the bonding of the top chip(s) to the substrate may take place after the bottom chips have been connected in a separate step, the bottom and top chips may be bonded substantially simultaneously in a single step, or the top and bottom chips may be connected to each other first and then substantially simultaneously be bonded to the substrate.

FIG. 4 shows a cross-sectional view of a chip-over-chip package in accordance with an alternate preferred embodiment of the present invention. The package 400 includes a packaging substrate 402 composed of any suitable material, such as ceramic or polymer/composite materials well known to those of skill in the art. The substrate may have solder balls 404 on its underside 406 to provide electrical connection of the package to a printed circuit board (PCB) (not shown). The package may also be of any suitable shape or size for its intended application, such as square, rectangular, large (e.g., greater than 50 mm per side), small (e.g., less than 10 mm per side), with or without mechanical stiffeners or heatspreaders, and others.

A plurality of flip chips may be connected to a cavity-less upper surface of a substrate, that is, as described above with reference to FIG. 1, a substrate that does not have a cavity in which a chip connected to the substrate is accommodated, with at least one chip overlying another. As depicted in FIG. 4, the substrate 402 has a cavityless upper surface 408. The surface 408 has an array of flip chip bonding pads (not shown) provided for connection of flip chips to the substrate via ball grid arrays (BGAs). The substrate 402 has two flip chips electrically connected to it via BGAs: A larger, upper chip 410 overlies a lower, smaller chip 412. Both chips may be underfilled with an underfill material 418, for example with any commonly used material for mechanical, chemical and/or humidity protection. A heatspreader and/or stiffener (not shown) may also be attached, using a thermally-conductive adhesive or other material, to the backside 420 of the top chip 410 to improve package performance.

Other aspects of the package described with reference to FIG. 4 may be as described with reference to FIG. 1, above. However, rather than attaching the bottom chip 412 to the top chip 410 with a thermally-conductive adhesive, such as may be done in accordance with the embodiments described with reference to FIG. 1, the top and bottom chips are electrically connected by solder bumps 422 (for example, a BGA having solder bumps about 2 mils in diameter) connecting bond pads (not shown) on the underside 430 of the top chip 410 and the top side 432 of the bottom chip 412. Top to bottom connections in the bottom chip 412 may also be made by through-hole vias in the silicon of the chip 412 connecting the top connections in the bottom chip 412 to silicon circuitry (not shown) on the underside 434. In this way, silicon circuitry could be oriented on either side of the bottom chip 412. This implementation of the invention optimizes electrical performance by reducing the interconnect length between the top chip 410 and the bottom chip 412 in a cavity-less package 400. This configuration may also be used to facilitate electrical connections from the bottom chip to other chips on the substrate, via the top chip. As shown in FIG. 4, the upper chip is electrically connected to the substrate via solder bumps 414.

As with the previously described embodiments herein, it should be understood that the principles of this embodiment may be extended to include a plurality of both top and bottom chips, up to many multiples of both, in a single package in accordance with the present invention. For example, one package substrate could support two or more top chips each with one or more bottom chips electrically connected to the substrate and to each other via solder bump connections (flip chip bonding). Configurations in accordance with this aspect of the present invention beyond that specifically depicted here are possible, and the depicted configuration is not intended to be limiting.

Vertically integrated (chip-over-chip) packages in accordance with the present invention require less space on the package substrate and may accommodate shorter interconnections between chips and to the package substrate. These advantages may result in lower package costs and higher package performance, measured electrically and thermally. Implementations of the chip-over-chip concept with bottom and/or top chips thinned as described herein may also provide for a thinner overall package size, which is important to many applications such as portable cameras, smart cards and portable phones. This invention may also facilitate low-cost integration of various semiconductor technologies, such as analog, digital, memory and logic functions.

Although the foregoing invention has been described in some detail for purposes of clarity of understanding, it will be apparent that certain changes and modifications may be practiced within the scope of the appended claims. It should be noted that there are many alternative ways of implementing both the process and apparatuses of the present invention. Accordingly, the present embodiments are to be considered as illustrative and not restrictive, and the invention is not to be limited to the details given herein, but may be modified within the scope and equivalents of the appended claims.

What is claimed is:

1. A semiconductor package comprising:
    a packaging substrate having a planar surface and a plurality of flip chip bonding pads on said surface;
    one or more lower flip chip devices, each having a top surface and a bottom surface, said one or more lower flip chip devices directly electrically connected to said substrate via solder bump connectors between said bottom surface and a first portion of said flip chip bonding pads; and
    one or more upper flip chip devices overlying at least a portion of said one or more lower flip chip devices, said one or more upper flip chip devices directly connected to said substrate via solder bump connectors between a substrate-facing surface and a second portion of said flip chip bonding pads.

2. The semiconductor package of claim 1, wherein said one or more upper flip chip devices is one or more logic chips.

3. The semiconductor package of claim 1, wherein said one or more lower flip chip devices is one or more memory chips.

4. The semiconductor package of claim 1, wherein said first portion of said flip chip bonding pads are bounded on at least two sides by said second portion of said flip chip bonding pads on said packaging substrate.

5. The semiconductor package of claim 1, wherein the one or more lower flip chip devices and the upper flip chip device are connected with a thermal adhesive.

6. The semiconductor package of claim 1, wherein the one or more lower flip chip devices is a single chip.

7. The semiconductor package of claim 6, wherein the one or more upper flip chip devices is a single chip and partially overlies the single flip chip device.

8. The semiconductor package of claim 7, wherein the upper flip chip device entirely overlies the single flip chip device.

9. The semiconductor package of claim 1, wherein the one or more lower flip chip devices is a plurality of chips.

10. The semiconductor package of claim 9, wherein the one or more upper flip chip device entirely overlies the plurality of flip chip devices.

11. The semiconductor package of claim 9, wherein the one or more upper flip chip devices partially overlies each of the plurality of flip chip devices.

12. The semiconductor package of claim 1, wherein said one or more lower flip chip devices is about 50 to 200 $\mu$m in thickness.

13. The semiconductor package of claim 12, wherein said one or more upper flip chip devices is between about 50 and 750 $\mu$m in thickness.

14. The semiconductor package of claim 13, wherein said one or more lower flip chip devices is about 50 to 100 $\mu$m in thickness and said one ore more upper flip chip devices is between about 100 and 500 $\mu$m in thickness.

15. The semiconductor package of claim 1, wherein at least one of the one or more upper flip chip devices and at least one of the lower flip chip devices are electrically connected to each other via solder bump connectors.

* * * * *